(12) United States Patent
Fischer et al.

(10) Patent No.: US 6,692,875 B2
(45) Date of Patent: Feb. 17, 2004

(54) MASK FOR OPTICAL PROJECTION SYSTEMS, AND A PROCESS FOR ITS PRODUCTION

(75) Inventors: Werner Fischer, Heilsbronn (DE); Fritz Gans, München (DE); Rainer Pforr, Dresden (DE); Jörg Thiele, München (DE)

(73) Assignee: Infineon Technologies AG, Munich (DE)

( * ) Notice: Subject to any disclaimer, the term of this patent is extended or adjusted under 35 U.S.C. 154(b) by 146 days.

(21) Appl. No.: 09/839,764

(22) Filed: Apr. 20, 2001

(65) Prior Publication Data

US 2002/0006554 A1 Jan. 17, 2002

(30) Foreign Application Priority Data

Apr. 20, 2000 (DE) .......................... 100 21 096

(51) Int. Cl.$^7$ ................................ G03F 9/00
(52) U.S. Cl. ................ 430/5; 430/22; 430/30
(58) Field of Search ................ 430/30, 313, 322, 430/5, 22

(56) References Cited

U.S. PATENT DOCUMENTS

| | | | |
|---|---|---|---|
| 5,085,957 A | * | 2/1992 | Hosono .................. 430/5 |
| 5,229,230 A | | 7/1993 | Kamon |
| 5,578,422 A | | 11/1996 | Mizuno et al. |
| 5,700,606 A | | 12/1997 | Kobayashi et al. |
| 5,786,113 A | * | 7/1998 | Hashimoto et al. ........ 430/5 |
| 5,821,014 A | * | 10/1998 | Chen et al. ............. 430/5 |
| 5,916,711 A | | 6/1999 | Salik et al. |
| 5,928,814 A | | 7/1999 | Yang et al. |

FOREIGN PATENT DOCUMENTS

| | | |
|---|---|---|
| JP | 04136854 A | 5/1992 |
| JP | 06282063 A | 10/1994 |
| JP | 06308715 A | 11/1994 |

* cited by examiner

*Primary Examiner*—Mark F. Huff
*Assistant Examiner*—Kripa Sagar
(74) *Attorney, Agent, or Firm*—Laurence A. Greenberg; Werner H. Stemer; Gregory L. Mayback

(57) ABSTRACT

A mask contains a transparent carrier material on which an opaque region is disposed as an image structure. Also disposed on the carrier material is a semitransparent dummy structure, which is spaced apart from all the image structures and differs from the image structure in terms of transparency and phase rotation. The smallest lateral extent of the dummy structure is then selected to be at least half as large as the smallest lateral extent of the image structure. The semitransparent dummy structure is formed in such a way that it is suitable for increasing the depth of focus of structures that stand individually or at least partially individually, in order thereby to improve the process window of the optical projection.

14 Claims, 3 Drawing Sheets

MASK FOR OPTICAL PROJECTION SYSTEMS, AND A PROCESS FOR ITS PRODUCTION

BACKGROUND OF THE INVENTION

Field of the Invention

The present invention relates to a mask for optical projection systems and to a process for its production.

Optical projection systems are used, for example, in semiconductor fabrication for transferring image structures.

During the projection of image structures standing individually or standing partially individually on the mask, distortion of the image occurs, as compared with compact image structures that are distinguished by the fact that further structures are disposed beside an image structure. The distortion leads to a line width deviation in the separated structure, which can lead to the individually standing image structure not being capable of being projected at the same time as the compact image structure. Furthermore, the depth of focus of the individually standing image structure is very low.

One known solution to the problem consists in changing the mask, in which the line width on the mask is changed in such a way that the optical distortion of the projection is counteracted. This method is also referred to as optical proximity correction. The optical proximity correction has the disadvantage, however, that the layout correction of the mask is very complicated and in each case necessitates preliminary trials, which are included iteratively in the distortion correction of the mask. Furthermore, the method of proximity correction suffers from the drawback that the distortion correction of the masks can be carried out only with finite, incremental steps. However, the decisive drawback consists in the small process window that can be achieved for the individually standing or partially individually standing image structures. The process window is understood here to be a limited field in the two-dimensional space that is covered by the focal axis, that is to say a spatial position of the focal plane and the dose axis. The process window is limited in the direction of the focal axis by the depth of focus and in the direction of the dose axis by the exposure freedom.

One known photomask technique consists in the use of "embedded phase shifters". These are masks that are specifically used to shift the phase of the light. One example of such a mask is given in U.S. Pat. No. 5,700,606. There, a phase shifting layer is applied to a semitransparent carrier material. An opaque layer is then disposed on the phase shifting layer. The "embedded phase shifter" technique leads to the imaging of undesired structures, which are produced by side bands (side lobes) being avoided.

A further known solution consists in the generation of what are known as sub-resolution structures, which are disposed in the vicinity of the individually standing or partially individually standing image structure. Sub-resolution structures are understood to be structures which, on account of their low geometric extent in at least one spatial dimension, are not transferred into a photosensitive layer. They are also referred to as lithographic dummy structures.

One drawback of the sub-resolution structure consists in the low structure size, which cannot be produced on the mask with the necessary accuracy and reproducibility. Furthermore, at present there are also unsolved problems for these structures in defect inspection and therefore also in defect repair.

SUMMARY OF THE INVENTION

It is accordingly an object of the invention to provide a mask for optical projection systems, and a process for its production which overcome the above-mentioned disadvantages of the prior art devices and methods of this general type, with which a compact image structure can be transferred into a photolithographic recording medium at the same time as an isolated image structure, with the same exposure dose.

With the foregoing and other objects in view there is provided, in accordance with the invention, a mask for an optical projection system. The mask contains a transparent carrier material, an image structure disposed on the carrier material, and a dummy structure disposed on the carrier material. The dummy structure is spaced apart from the image structure and differs from the image structure in terms of transparency and phase rotation.

With respect to the process, the object set is achieved by a process for producing the mask for an optical projection system, with the steps of forming the image structure on the transparent carrier material, and forming the dummy structure on the carrier material. The dummy structure is spaced apart from all the image structures and differing from the image structure in terms of transparency and phase rotation.

The present invention provides for the dummy structure to be spaced apart from all the image structures and to differ from the image structure in terms of transparency and phase rotation. As a result, an enlarged process window for the projection of the image structures is achieved, which has an advantageous effect on the reproducibility and accuracy of the structures to be projected.

One advantageous embodiment of the invention provides for the dummy structure to be semitransparent. The use of a semitransparent and, if necessary, also phase shifting material, which in the most favorable case produces a phase rotation of 360°, makes it possible to apply the dummy structures which, in terms of their geometric dimensions, do not have to be smaller than the image structures to be projected. The semitransparency results in that the dummy structures are not transferred into the photolithographic recording medium. The advantage resides in the fact that only the same conditions are placed on the dummy structures, relating to minimum structure width, reproducibility and lithographic resolution during the production of the mask, as those placed on the actual image structures to be transferred. The semitransparent dummy structures achieve the situation where the process window for the relevant image structures is enlarged, so that the depth of focus of individual image structures is enlarged and the dose fluctuation sensitivity is reduced. The semitransparent dummy structures are therefore not geometrically below the resolution limit but in the sense of the photolithographic sensitivity of the recording medium. The dose that is transmitted through the semitransparent layer, the dose being lower as compared with the transparent carrier material, exposes the recording medium below its tolerance threshold.

A further advantageous embodiment of the invention provides for the smallest lateral extent of the dummy structure to be at least half as large as the smallest lateral extent of the image structure. In this case, the advantage resides in the relatively large dummy structures, which can be formed at the same order of magnitude as the image structures. As a result, the same conditions relating to minimum structure width, reproducibility and lithographic resolution during the production of the mask are placed on the dummy structures as those placed on the image structures actually to be transferred.

It is advantageous if the smallest lateral extent of the dummy structure is greater than $$\frac{0.25 \cdot \lambda}{NA},$$

where λ is a wavelength of a projecting light and NA is a numerical aperture of the projecting system.

A further advantageous embodiment of the invention provides for the smallest lateral extent of the dummy structure to be at least as large as the smallest lateral extent of the image structure. The fact that the dummy structure is semitransparent results in that it does not have to be significantly smaller, in terms of its geometric dimensions, but preferably can be at most exactly as small as the image structure to be transferred. As a result, the requirements on the mask production are significantly more relaxed, more reproducible and it is possible to inspect these structures more simply for defects and to carry out repair measures.

In a further advantageous embodiment of the mask according to the invention, the dummy structure is composed, in terms of its geometric dimensions and its transparency, in such a way that it is not transferred into a photographic recording medium as an independent image structure. This configuration ensures that the dummy structure is used in increasing the depth of focus and therefore enlarging the process window, but does not cause any undesired structures in the recording medium.

A further advantageous embodiment of the mask according to the invention provides for the semitransparent dummy structure to be optically homogeneous. The optical homogeneity improves the reproducibility and uniform action of the semitransparent auxiliary layer.

In a further advantageous embodiment of the mask according to the invention, the semitransparent auxiliary layer is, at least to some extent, disposed approximately parallel to the corresponding image structure.

A further advantageous embodiment of the mask according to the invention provides for the semitransparent dummy structure to be formed as a group of island-like individual structures, the island-like individual structures having a uniform geometric shape. The island-like embodiment and group-like configuration of the semitransparent dummy structure makes it possible to use an elementary optical correction module which, in terms of its optical effect, can be predicted by fast, simple and compact simulation methods, in particular in the case of a non-rectilinear configuration of the image structure to be supported. As a result, fast and efficient correction is possible for such structure geometries.

In a further advantageous embodiment of the configuration according to the invention, the light which is used for exposure in the optical projection system exhibits a phase rotation of a multiple of 360° as it passes through the semitransparent dummy structure, with a deviation of at most ±30° with respect to the passage through the carrier material. Since the light experiences a phase shift of a multiple of 360°, the interferences which are produced on the projection plane can advantageously be used to expose the photographic recording medium, and the process window is advantageously enlarged. In practice, a tolerance range of ±30° has been shown to be a practicable solution. In addition, it has also proven to be advantageous to use a tolerance range of at most ±10°.

In an advantageous embodiment of the mask according to the invention, the image structure to be projected contains an opaque layer.

In a further advantageous embodiment of the mask according to the invention, the image structure to be projected contains a semitransparent layer. Within the context of the solution according to the invention, provision is also made to form the image structure to be projected as a layer stack containing an opaque layer and a semitransparent layer.

In a further advantageous embodiment of the mask according to the invention, the semitransparent dummy structure contains a semitransparent layer. This makes it possible to etch the semitransparent dummy structure out of a semitransparent layer applied to the entire surface, following a lithographic structuring process.

In a further advantageous embodiment of the mask according to the invention, the semitransparent layer is formed of the same material as the opaque layer, but has a lower thickness. This makes it possible to form the semitransparent layer from the opaque layer, by the opaque layer being thinned at points provided for that purpose.

In a further advantageous embodiment of the mask according to the invention, the carrier material is thinned in an interspace. As a result of this procedure, the phase shift between the passage of light through the carrier material and the passage of light through the semitransparent layer can be matched to each other, so that, advantageously, it exhibits a relative phase difference of only n·360°±30° or, in an advantageous embodiment of ±10° or, in a particularly advantageous embodiment, of ±0° (n is an element from the whole numbers).

In an advantageous embodiment of the process according to the invention, a largely opaque layer is formed and structured on the carrier material. In addition, it is advantageous to form a semitransparent layer on the carrier material and likewise to structure the layer. This procedure likewise makes it possible to form the semitransparent layer underneath the opaque layer, so that a layer stack containing a semitransparent layer and an opaque layer is produced. Then, in a lithographic step and in an etching step, the opaque layer and the semitransparent layer are structured at the same time.

Furthermore, a layer is deposited on the mask, the layer is suitable to set the transparency and the phase of the semitransparent dummy structures.

In a further mode of the invention, the carrier material is thinned in a region to form an interspace.

In a concomitant mode of the invention, the opaque layer is thinned in regions.

Other features which are considered as characteristic for the invention are set forth in the appended claims.

Although the invention is illustrated and described herein as embodied in a mask for optical projection systems, and a process for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
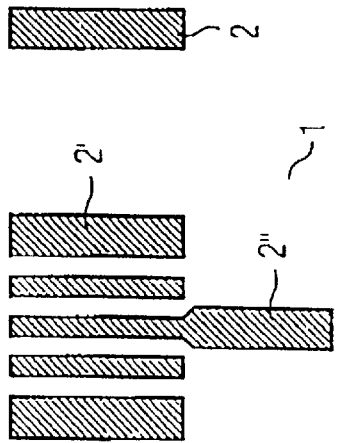
FIG. 1 is an illustration of an image structure that is to be transferred into a photographic recording medium.

In all the figures of the drawing, sub-features and integral parts that correspond to one another bear the same reference symbol in each case. Referring now to the figures of the drawing in detail and first, particularly, to FIG. 1 thereof, there is shown a structure of the type which is to be produced in a photographic recording medium by optical projection. The structure contains an image structure 2 and further image structures 2' and 2". In general, the designations marked with ' designate further embodiments of the feature provided with the designation.

Figure 2:
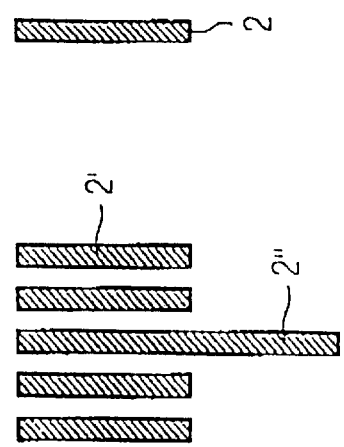
FIG. 2 is an illustration of a mask which has been modified by optical proximity correction, in order to transfer the image structure illustrated in FIG. 1 into the photographic recording medium.

FIG. 2 illustrates a mask according to the prior art corrected by line widening, which can be used for the purpose of generating the structure illustrated in FIG. 1 with equal-sized lines in a photographic recording medium by projection. The mask from FIG. 2 is formed on a transparent carrier material, on which the image structure 2 is disposed. The image structure 2 is broader than the image structure 2 illustrated in FIG. 1, in which the proximity correction exists. Likewise, the image structures 2' and 2" have been modified as compared with FIG. 1.

Figure 3:
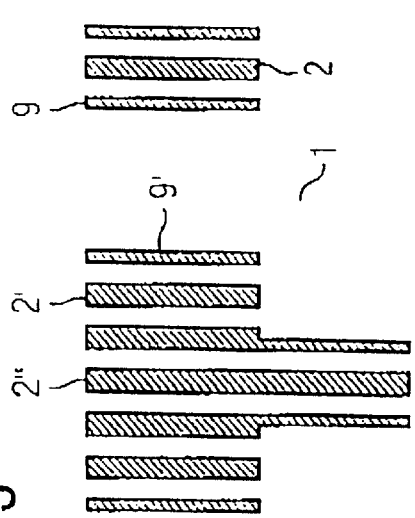
FIG. 3 is an illustration of the mask with sub-resolution structures, which is used to correct optical distortion in projections.

FIG. 3 shows a further mask according to the prior art, which has the image structures 2, 2' and 2" to be projected on a carrier material 1. Furthermore, what are known as sub-resolution structures 9 and 9' are disposed on the mask and lie considerably below the structure size that can be transferred to the carrier material by an optical projection process. The sub-resolution structures 9 and 9' are suitable for enlarging the process window and therefore the depth of focus for the projection of the image structures 2, 2' and 2". However, the sub-resolution structures 9, 9' have the disadvantage that the necessary small structure size, which lies far below the projection wavelength, can be produced only with great difficulty with the required accuracy and reproducibility. Furthermore, the sub-resolution structures 9, 9' evade a simple inspection method, since, because of their small dimensions, they cannot be checked for defects with the conventional inspection instruments used in mask technology. The repair of possible defects that have occurred in the sub-resolution structures 9, 9' is therefore virtually impossible.

Figure 4:
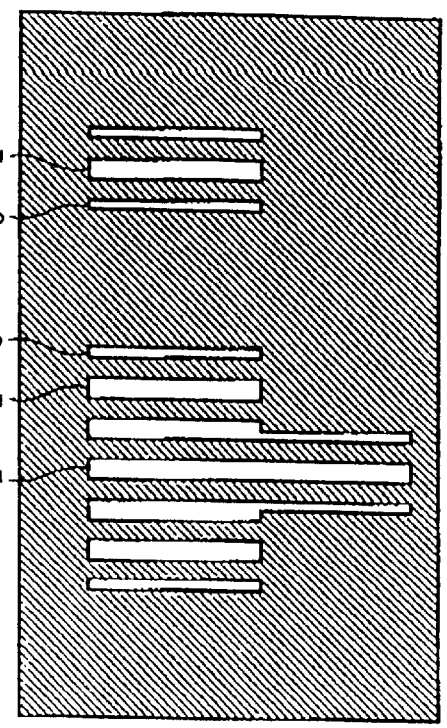
FIG. 4 is an illustration of the mask with a tonal-value inverse structure of FIG. 3.

FIG. 4 illustrates a tonal-value inverse structure to FIG. 3. The illustration shows the carrier material 1 and an image structure 2. The "sub-resolution structures" are used in FIG. 4, as already in FIG. 3, and are accompanied by the known disadvantages.

By use of the masks illustrated in FIG. 3 and FIG. 4, both isolated webs and isolated gaps in the projection fidelity can be improved.

Figure 5:
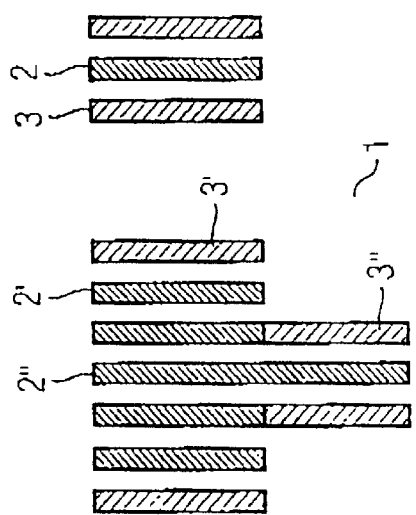
FIG. 5 is an illustration of an embodiment of the mask according to the invention.

FIG. 5 illustrates a first mask according to the invention. The image structures 2, 2' and 2" to be projected are disposed on the carrier material 1. In this exemplary embodiment, the carrier material 1 is transparent and, for example, is formed of glass or quartz. The image structure 2 to be projected is opaque. It is formed, for example, of a chromium layer that is disposed on the carrier material 1. Also disposed on the carrier material 1 are semitransparent dummy structures 3, 3' and 3". The semitransparent dummy structures 3, 3' and 3" are configured in this exemplary embodiment in such a way that they enlarge the lithographic process window of the image structures 2, 2' and 2". The semitransparent dummy structures 3 are, for example, a thinned chromium layer that, as a result of its low thickness, has an optical transparency which is greater than the transparency of the image structure 2 to be projected. In addition, it is also possible, instead of using chromium, to use any other suitable, semitransparent material and to structure it appropriately.

Figure 6:
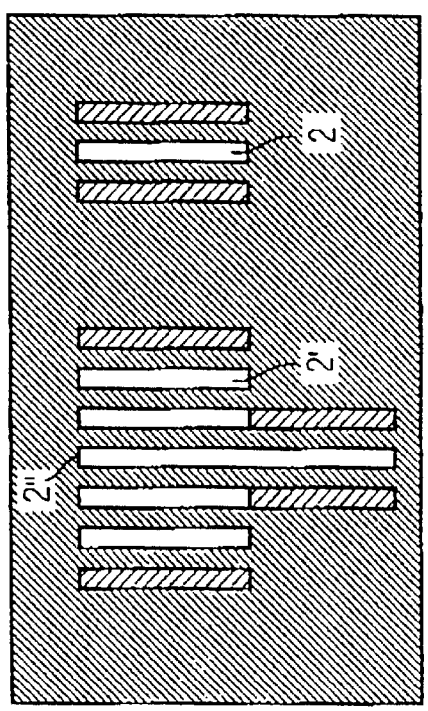
FIG. 6 is an illustration of a further embodiment of the mask which, as compared with FIG. 5, has a tonal value-inverse configuration of the structures.

FIG. 6 illustrates a second exemplary embodiment of the mask according to the invention. The mask illustrated in FIG. 6 is substantially a tonal-value inverse structure to the mask illustrated in FIG. 5. The mask in FIG. 6 contains the carrier material 1 that is transparent. Disposed on the carrier material 1 is an opaque layer, in which the image structure 2 is disposed. Also disposed on the carrier material 1 is a semitransparent dummy structure 3. The semitransparent dummy structure 3 has a transparency that lies between the transparency of the carrier material 1 and the transparency of the opaque layer. Here, too, the depth of focus of the image structures 2, 2' and 2" to be projected is increased by the configuration of the semitransparent dummy structure 3, 3', 3".

Figure 7:
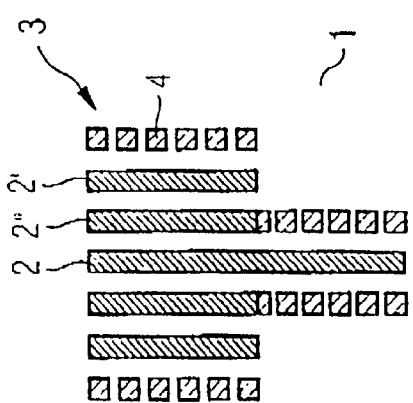
FIG. 7 is an illustration of a further mask which has island-like individual structures.

FIG. 7 illustrates a third exemplary embodiment according to the invention. The mask from FIG. 7 contains the carrier material 1 on which the image structure 2 is disposed. Disposed beside the image structure 2 is the semitransparent dummy structure 3, which consists of island-like individual structures 4.

Figure 8:
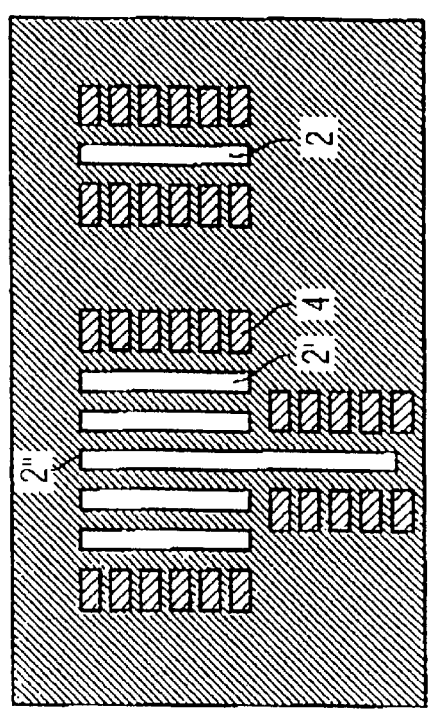
FIG. 8 is an illustration of a further exemplary embodiment of the mask, which is configured as a tonal-value inverse to the mask illustrated in FIG. 7.

FIG. 8 illustrates the tonal-value inverse photomask to the photomask illustrated in FIG. 7. The mask contains the carrier material 1, which is covered by the opaque layer in which the image structure 2 is disposed. Also disposed on the carrier material 1 are the semitransparent dummy structures 3 and 3' which, in this exemplary embodiment, consist of island-like individual structures 4.

Figure 9:
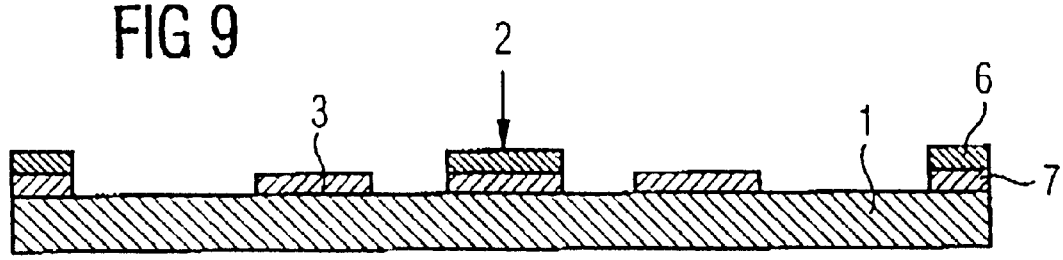
FIG. 9 is a diagrammatic, cross-sectional view through a mask according to the invention.

FIG. 9 illustrates a section through the mask according to the invention for use in an optical projection system. The mask contains the carrier material 1 to which a semitransparent layer 7 is applied. The semitransparent layer 7 is structured in such a way that the semitransparent dummy structure 3 is produced on the carrier material 1. Also on the semitransparent layer 7 is an opaque layer 6. The opaque layer 6 is likewise structured, so that the image structure 2 is disposed on the carrier material 1. In this exemplary embodiment, the image structure 2 contains the semitransparent layer 7 and the opaque layer 6 that is disposed on the semitransparent layer 7. With reference to FIG. 9, a manufacturing process for the mask according to the invention will now be described. First, the carrier material 1 is provided, to which the semitransparent layer 7 is applied. The opaque layer 6 is applied to the semitransparent layer 7. The opaque layer 6 and the semitransparent layer 7 are subsequently structured in such a way that the image structure 2 is produced. In a second process step, the opaque layer resting on the dummy structures 3 is removed, so that the semitransparent dummy structure 3 is produced.

Figure 10:
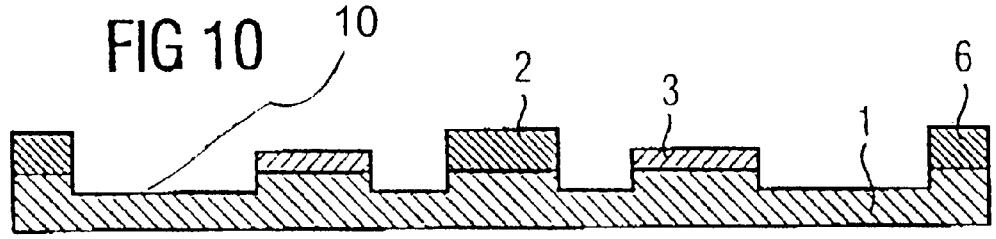
FIG. 10 is a cross-sectional view through a second embodiment of the mask.

FIG. 10 illustrates a further embodiment of the mask according to the invention. The mask contains the carrier material 1 on which the image structure 2 is disposed that is formed, for example, of chromium. In addition, the mask contains the semitransparent dummy structure 3, which is likewise disposed on the carrier material 1. In this exemplary embodiment, the semitransparent dummy structure 3 likewise is formed of a chromium layer, but it has a substantially lower thickness, so that it is semitransparent. In addition, the carrier material 1 is thinned in an interspace 10 which is not covered by an image structure 2 or a semitransparent dummy structure 3.

A further production process for the mask according to the invention will be explained with reference to FIG. 10. First, the carrier material 1 is provided. The opaque layer 6 which, in this exemplary embodiment, is formed of chromium, is disposed on the carrier material 1. The opaque layer 6 is then covered at the positions at which the image structure 2 and the semitransparent dummy structure 3 are produced. Using an etching process, the opaque layer 6 is removed in the regions that are not covered. With a further etching process, the semitransparent dummy structure 3 is thinned in such a way that it has a higher transparency than the image structure 2. In a further etching process, the carrier material 1 is thinned in the interspace 10, so that the phase difference when light passes through the thinned carrier material experiences a phase rotation of a multiple of 360° as compared with the semitransparent dummy structure 3.

Figure 11:
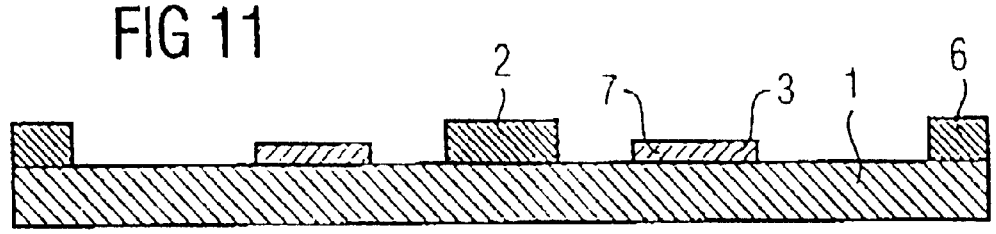
FIG. 11 is a cross-sectional view through a third exemplary embodiment of the mask.

FIG. 11 illustrates a further exemplary embodiment of the mask according to the invention. The mask contains the carrier material 1, on which the image structure 2 and the dummy structure 3 are disposed. The image structure 2 is formed of the opaque layer 6, the semitransparent dummy structure 3 is formed of a semitransparent layer 7.

A corresponding production process provides the carrier material 1. The opaque layer 6 is formed and structured on the carrier material 1, so that the opaque image structure 2 is produced. The semitransparent layer 7 is then produced and structured on the carrier material 1 and on the image structure 2, so that the semitransparent dummy structure 3 is produced. The order in which the opaque layer 6 and the semitransparent layer 7 are formed and structured can be interchanged in this exemplary embodiment.

Figure 12:
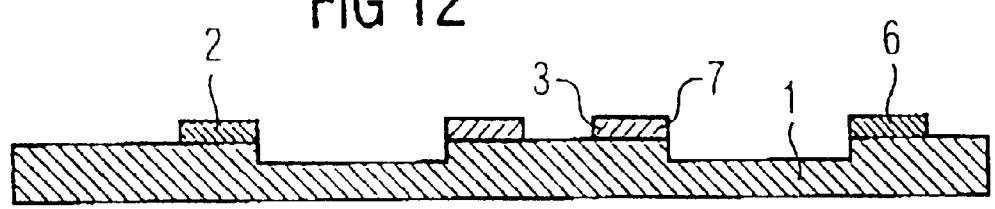
FIG. 12 is a cross-sectional view of a fourth exemplary embodiment of the mask.

FIG. 12 illustrates another exemplary embodiment of the mask according to the invention. The mask contains the carrier material 1 on which the image structure 2 is disposed. The image structure is formed from the opaque layer 6. Also disposed on the carrier material 1 is the semitransparent dummy structure 3, which is formed from the semitransparent layer 7. FIG. 12 differs from FIG. 11 in that the carrier material 1 is thinned at positions that are not covered by the image structure 2 and not covered by the semitransparent dummy structure 3. In order to produce the mask illustrated in FIG. 12, the process explained in FIG. 11 is used. However, the carrier material 1 is subsequently thinned at envisaged positions.

We claim:

1. A mask for an optical projection system, comprising:
a transparent carrier material;
an image structure disposed on said carrier material; and
a dummy structure disposed on said carrier material, said dummy structure spaced apart from said image structure and differs from said image structure in terms of transparency and phase rotation, a smallest lateral extent of said dummy structure being at least half as large as a smallest lateral extent of said image structure, said dummy structure being semitransparent and optically homogeneous, said dummy structure including a group of island-shaped individual structures, said island-shaped individual structures having a uniform geometric shape.

2. The mask according to claim 1, wherein a smallest lateral extent of said dummy structure is at least as large as a smallest lateral extent of said image structure.

3. The mask according to claim 1, wherein said semitransparent dummy structure runs parallel to said image structure.

4. The mask according to claim 1, wherein light used for projecting in the optical projection system experiences a phase rotation of a multiple of 360° as it passes through said semitransparent dummy structure, with a deviation of at most ±30° with respect to a passage through said transparent carrier material.

5. The mask according to claim 4, wherein the deviation is at most ±10°.

6. The mask according to claim 1, wherein said image structure has an opaque layer.

7. The mask according to claim 6, wherein said image structure has a semitransparent layer.

8. The mask according to claim 7, wherein said semitransparent layer is formed of a same material as said opaque layer but has a lower thickness.

9. The mask according to claim 1, wherein said carrier material has an interspace formed therein resulting in a thinned area.

10. A process for producing a mask for an optical projection system, comprising:
providing a transparent carrier material;
forming an image structure on the transparent carrier material; and
forming a dummy structure on the carrier material, the dummy structure being spaced apart from the image structure and differing from the image structure in terms of transparency and phase rotation, a smallest lateral extent of the dummy structure being at least half as large as a smallest lateral extent of the image structure, the dummy structure being semitransparent and optically homogeneous, the dummy structure including a group of island-shaped individual structures, the island-shaped individual structures having a uniform geometric shape.

11. The process according to claim 10, which comprises forming and structuring an opaque layer on the transparent carrier material.

12. The process according to claim 10, which comprises forming and structuring a semitransparent layer on the transparent carrier material.

13. The process according to claim 10, which comprises thinning the transparent carrier material in a region to form an interspace.

14. The process according to claim 11, which comprises thinning regions of the opaque layer.

* * * * *